(12) United States Patent
Hwu

(10) Patent No.: US 6,215,598 B1
(45) Date of Patent: Apr. 10, 2001

(54) APPARATUS AND METHOD FOR CONCENTRATING BEAMS FROM BROAD AREA DIODE LASERS, DIODE LASER BARS AND/ OR DIODE LASER ARRAYS

(76) Inventor: Ruey Jennifer Hwu, 3767 E. Brockbank Dr., Salt Lake City, UT (US) 84124

( * ) Notice: Subject to any disclaimer, the term of this patent is extended or adjusted under 35 U.S.C. 154(b) by 0 days.

(21) Appl. No.: 09/166,020

(22) Filed: Oct. 5, 1998

(51) Int. Cl.⁷ .................................................. G02B 27/30
(52) U.S. Cl. .......................................................... 359/641
(58) Field of Search .................... 359/618, 631, 359/641, 619, 621, 627

(56) References Cited

U.S. PATENT DOCUMENTS

| | | | |
|---|---|---|---|
| 3,906,499 | * 9/1975 | Redman | 342/167 |
| 3,950,079 | * 4/1976 | Rambauske | 359/226 |
| 5,115,445 | 5/1992 | Mooradian | 372/75 |
| 5,212,707 | 5/1993 | Heidel et al. | 372/50 |
| 5,307,429 | 4/1994 | Kepros et al. | 385/15 |
| 5,319,496 | 6/1994 | Jewell et al. | 359/741 |
| 5,515,394 | 5/1996 | Zhang | 372/72 |
| 5,521,748 | * 5/1996 | Sarraf | 359/321 |
| 5,568,318 | * 10/1996 | Leger et al. | 359/618 |
| 5,745,296 | * 4/1998 | Nakamura et al. | 359/641 |
| 5,761,234 | 6/1998 | Craig et al. | 372/75 |
| 5,787,107 | * 7/1998 | Leger et al. | 372/71 |
| 5,790,576 | * 8/1998 | Waarts et al. | 372/43 |
| 5,808,657 | * 9/1998 | Kurtz et al. | 347/239 |
| 5,900,981 | * 5/1999 | Oren et al. | 359/619 |
| 5,969,872 | * 10/1999 | Oren et al. | 359/621 |
| 5,995,289 | * 11/1999 | Hwu et al. | 359/627 |
| 5,995,475 | * 11/1999 | Gelbart | 369/112 |

FOREIGN PATENT DOCUMENTS

| | | |
|---|---|---|
| 197 00 720 A1 | 7/1998 | (DE) . |
| 0 063 309 A1 | 10/1982 | (EP) . |
| 0 601 485 A2 | 6/1994 | (EP) . |
| 09061610 | 3/1997 | (JP) . |
| PCT/EP98/00101 | 1/1998 | (WO) . |

OTHER PUBLICATIONS

"Binary Optics: New Diffractive Elements for the Designer's Tool Kit," by Alan Kathman and Eric Johnson, Photonics Spectra, pp. 124–132 (Sep. 1992).
"Binary Optics: New Diffractive Elements For The Designer's Tool Kit," by Alan Kathman and Eric Johnson, Photonics Spectra, pp. 124–132 (Sep. 1992).
"Binary Optics", by Wilfrid B. Veldkamp and Thomas J. McHugh, *Scientific American*, May 1992, pp. 92–97.
"Binary Optics: New Diffractive Elements For The Designer's Tool Kit", by Alan Kathman and Eric Johnson, *Photonics Spectra*, page numbers unknown.
"Visible Sources Venture Beyond Research Markets", by Bruce Craig, *Laser Focus World*, Nov. 1997, pp. 91–97.
"DPSS Lasers Challenge Water–Cooled ION Lasers", by William L. Nighan Jr. and Bruce Craig, *Laser Focus World*, Apr. 1996, pp. 63–70.

* cited by examiner

Primary Examiner—Ricky Mack
(74) Attorney, Agent, or Firm—Christensen O'Connor Johnson Kindness PLLC

(57) ABSTRACT

Apparatus for concentrating a broad area laser beam, beams from diode laser bars and/or diode laser arrays include a collimating device disposed adjacent to the laser source for collimating and directing the laser beams into a laser beam sheet in a first direction, and a digital optics device disposed in the first direction from the collimating device for shaping and concentrating the laser beam sheet into a narrow overlapping laser beam. The concentrating device includes a pair of diffractive or digital optical devices positioned in the pathway of the collimated laser beams such that the first optical device causes the collimated beams to converge and the second optical device forms the converging beams into the desired collimated laser beam.

17 Claims, 5 Drawing Sheets

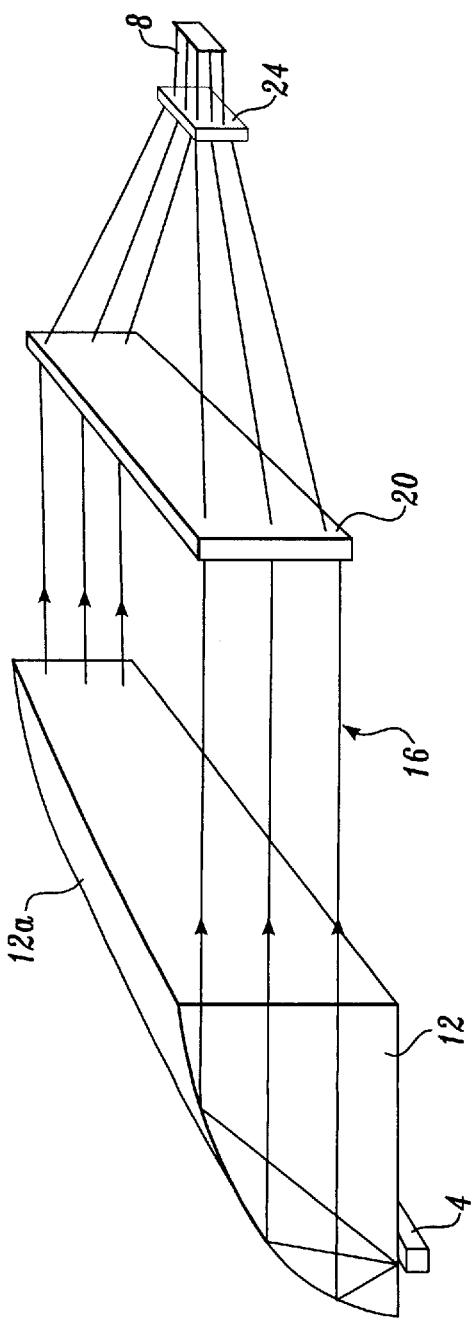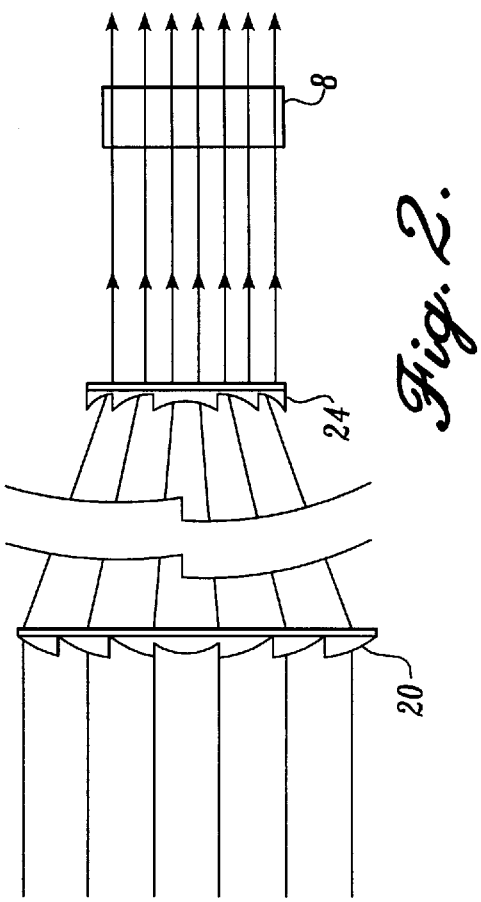

APPARATUS AND METHOD FOR CONCENTRATING BEAMS FROM BROAD AREA DIODE LASERS, DIODE LASER BARS AND/ OR DIODE LASER ARRAYS

BACKGROUND OF THE INVENTION

1. Field of the Invention.

The present invention relates to an apparatus and method for shaping and concentrating broad area laser beams and beams from broad area diode lasers, diode laser bars and/or diode laser arrays into narrow overlapping beams for coupling, for example, to an optical-fiber amplifier, to a solid-state laser, etc.

2. Relevant Technology and Prior Art.

A laser is a device which utilizes the transitions between energy levels of atoms or molecules to amplify or generate light. When an electron makes a transition from a higher energy level to a lower energy level, a photon, the elementary quantity of radiant energy, is emitted. In what is referred to as "stimulated emission", an incoming photon stimulates an electron to change energy levels, which amplifies the number of exiting photons. In fact, this is the origin of the term laser: light amplification by the stimulated emission of radiation. The emitted photon travels in the same direction and is in the same phase as the incoming photon.

One example of a conventional laser is the semiconductor diode laser. Semiconductor lasers are particularly useful for several reasons: they are capable of generating coherent radiation in the wavelength range which is particularly useful for optical fiber communications; they are relatively easy to fabricate and less costly than conventional, larger gas lasers; and they have a compact size which is useful in many applications including optical fiber communications, printing and medical treatments.

One example of a particular type of semiconductor diode laser is the broad area diode laser. The "broad area" refers to the junction plane from whence the laser radiation originates. Most broad area semiconductor lasers comprise a so-called "stripe" geometry which provides several advantages. First, there is improved response time due to small junction capacitance. Further, the thin active layer which is the area wherein the laser radiation is generated and confined, contributes to a smaller cross sectional area. This reduces the operating current, which is necessary for sustained operation of the laser, and also reduces the threshold current, which is the current required to induce a laser device to commence lasing action.

However, the laws of diffraction dictate that beam divergence, which is not desirable, will greatly increase with decreasing aperture size. Yet, most applications require a small beam with maximum power in the smallest area possible. Increasing the width of the aperture does not help, because not only does it reduce the power per area of the emitted beam, it has been demonstrated that the modal characteristics are significantly degraded as the aperture width is increased past a certain point. As this width is increased, the mode degrades from a single, good quality Guassian intensity profile, to several filaments (hot spots) of the beam dispersed or spread over the lateral dimension of the beam.

Another example of a semiconductor laser is a diode laser bar. Attempts have been made to increase the power of semiconductor lasers by combining multiple diode lasers into what is termed a "laser array". The advantage of placing individual diode lasers into an array is that the overall output power can be increased by phase locking several diode lasers together such that they operate as a single source. Yet, even though the power does increase when multiple lasers are combined to produce multiple beams, the quality is extremely poor. In turn, users are force to spend increased time and money in attempting to alleviate the poor laser quality of the laser arrays, with less than ideal results.

Over the last decade there has been a tremendous amount of research effort spend in designing and fabricating high power arrays with adequate modal control and degree of coherence. Commercially available diode laser arrays have been available for the last few years which utilize stacked configurations of bars of laser diodes which lie in the grooves of a planar substrate containing a heat sink for the device. These stacked diode bars use a technology which is built upon "rack and stack" configurations. See, e.g., U.S. Pat. No 5,311,535 and No. 5,526,373.

Yet, the use of diode laser bars in this stacked design has a number of disadvantages. The emitted laser beams from laser diode arrays experience significant divergence. This problem is addressed in U.S. Pat. No. 5,311,535 and No. 5,668,825. Specifically, the individual lenses are placed at a predetermined distance with respect to each diode laser. The radiation emitted from each diode laser passes through a lens which collimates the laser beam. Such a system requires the fabrication of multiple of microlenses and the accurate placement of each, which complicates the manufacturing process thereby raising the overall cost of the system. In addition, any misalignments in the placement of the lenses greatly reduces the efficiency of the system, yet adjustments in alignment are extremely difficult. This system at its best is able to convert electrical power into optical power at an efficiency of about 50 percent.

U.S. Pat. No. 5,333,077 suggests an alternative solution to the problem of the diverging emission which comprises a combination of aperture filling and geometrical transformation, and requires arrays of lenses. The lenses are diffractive lenses, the fabrication of which, with the appropriate profiles, is difficult, time consuming, and costly.

SUMMARY AND OBJECTS OF THE INVENTION

It is an object the present invention to provide small, inexpensive, and yet high power laser sources.

It is another object of the invention to provide control of the divergence of laser beams from broad area diode lasers, diode laser bars, and diode laser arrays.

A further object of the invention is to provide apparatus for collimating and concentrating broad area laser beams into a narrow, overlapping beam.

It is also an object of the invention to provide such apparatus which reduces the filamentation problem in broad area lasers.

It is still another object of the invention to provide such apparatus which enables coupling a broad area laser beam to a fiber optic strand, non-linear crystal, and the like.

The above and other objects of the invention are realized in a specific illustrative embodiment of apparatus for shaping and concentrating broad area laser beams developed by such sources as broad area diode lasers, diode laser bars or diode laser arrays. The apparatus includes a collimating device disposed adjacent to the laser source for collimating and directing the broad area laser beams into a laser beam sheet in a first direction, and a diffractive or digital optics device disposed in the first direction from the collimating device for shaping and concentrating the laser beam sheet into a narrow, overlapping laser beam.

The narrow laser beam has high intensity and is suitable for obtaining higher output power in diode pumped solid state lasers and harmonic diode lasers, for example, and is suitable for coupling to optical fibers for transmission. The concentrating device functions to direct different portions of a broad area laser beam toward the same location so that the portions overlap one another and concentrate the power of the laser beam.

In accordance with one aspect of the invention, the collimating device may be a transparent body of material, one side of which is formed with an elongate, hemi-parabolic-shaped surface about a focal line, and coated with an inwardly reflective coating such that laser beams emitting from the focal line through the body of material are reflected from the reflective coating in a collimated fashion.

In accordance with another aspect of the invention, the concentrating device may include a pair of diffractive or digital (binary) optical devices positioned in the pathway of the collimated laser beams such that the first optical device causes the collimated beams to converge and the second optical device forms the converging beams into the desired collimated narrow laser beam.

BRIEF DESCRIPTION OF THE DRAWINGS

The above and other objects, features and advantages of the invention will become apparent from a consideration of the following detailed description presented in connection with the accompanying drawings in which:

FIG. 1 is a side, elevational view of apparatus for shaping and concentrating a broad area laser beam into a narrow beam, in accordance with the principles of the present invention;

FIG. 2 is a side, elevational view of digital or diffractive optic devices suitable for concentrating a collimated laser beam in accordance with the present invention;

DETAILED DESCRIPTION

Figure 3:
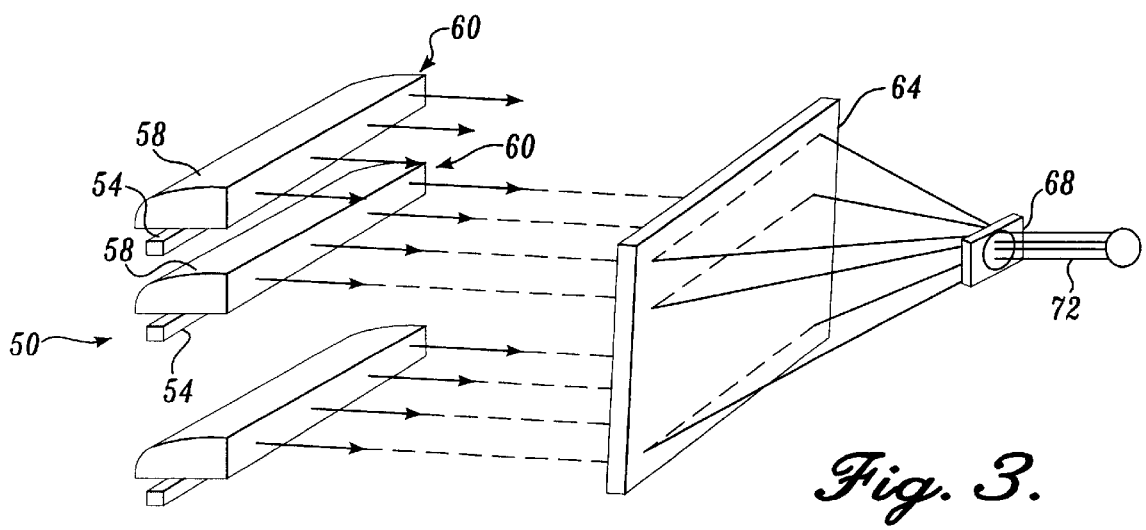
FIG. 3 is a perspective view of a two-dimensional beam shaper/concentrator, made in accordance with the principles of the present invention.

FIG. 1 is a perspective view of one embodiment of apparatus for shaping and concentrating a broad area laser beam emitted from a broad area laser beam emitter 4, into a narrow laser beam 8 with minimal beam divergence. The narrow laser beam 8 with high power concentrated in a narrow area is suitable, for example, for end pumping solid state lasers. The apparatus includes an elongate transparent body of material 12, such as glass, clear plastic, etc., having a hemi-parabolic shaped side 12a coated with an inwardly reflective coating such as aluminum, nickel or the like. The broad area laser 4 is disposed along the parabolic focal line of the surface 12a so that laser light emitted from along this focal line toward the surface 12a is reflected from the surface to form a sheet of collimated laser light 16 emerging from the body 12. Note that the light emitted from the broad area laser 4 is divergent and that the transparent body 12 with reflective surface 12a collimates the light and directs it in a sheet in one direction.

The sheet of collimated laser light 16 is intercepted by a beam shaping element 20 which causes the sheet of light to converge towards a second shaping element 24. The second shaping element 24 receives the collimated converging beams and focuses and forms them into the narrow laser beam 8.

The beam shaping elements 20 and 24 might advantageously be diffractive or digital (binary) optical elements such as described in Veldkamp, Wilford B. and McHugh, Thomas J., "Binary Optics", *Scientific American*, May 1992, pp. 92–97. Diffractive and digital optical elements 20 and 24 are illustrated in top plan view in FIG. 2 to be thin sheets of optical material whose surfaces are etched to bend light by diffraction (in addition to refraction) as desired by the user. Such diffraction optical elements are much thinner and lighter than corresponding refractive elements and thus can be made much more compact.

As indicated earlier, the narrow laser beam 8, having a width of a few millimeters down to a few microns, can be end coupled to non-linear crystals used to "pump" solid state lasers or to generate harmonic frequencies in harmonic lasers. Similarly, the narrow laser beam 8 may be end coupled into optical fibers for light transmission, amplification and/or frequency/wavelength conversion.

The principles employed in the apparatus of FIG. 1 for the broad area laser diode 4 can also be applied to diode laser bars and diode laser arrays. Diode laser bars have been widely used as integrated units of 20 to 40 diode lasers, for example. A plurality of diode laser bars could additionally be stacked on top of one another to form two-dimensional diode laser arrays. Obviously, significantly higher power is achieved with the two-dimensional diode laser arrays.

FIG. 3 shows a two-dimensional diode laser array 50 composed of a plurality of stacked assembled broad area diode laser arrays or laser bars 54. Each assembled broad area diode laser array or laser bar 54 is positioned along the focal line of a corresponding hemi-parabolic reflective surface 58 of corresponding transparent body 62. Each assembled broad area diode laser array or laser bar 54 and corresponding transparent body 60 with reflective surface 58 of FIG. 3 is positioned in a manner similar to the laser source 4 and transparent body 12 of FIG. 1.

The laser beams produced by the laser sources 54 are collimated by the respective transparent body 60 into sheets of laser beams which are directed towards laser shaping and concentrating optics 64. The optics 64 could advantageously be the diffractive or digital optics previously described in connection with FIGS. 1 and 2.

The diffractive or digital optics 64 bends and concentrates the laser beams received from the two-dimensional array 50, and directs the beams towards diffractive or digital optics 68 which shapes the beams into one high power, narrow beam 72.

An alternative laser shaping arrangement utilizing some of the FIG. 3 apparatus could include employing a single broad area diode laser bar 54, and positioning between the laser bar and the laser shaping and concentrating optics 64, second laser shaping optics, preferably diffractive or digital optics, for receiving laser beams from the laser bar and directing them to the shaping and concentrating optics 64. In other words, two separate shaping optics (diffractive of digital) are used, and no transparent/reflective bodies are required.

Figure 4:
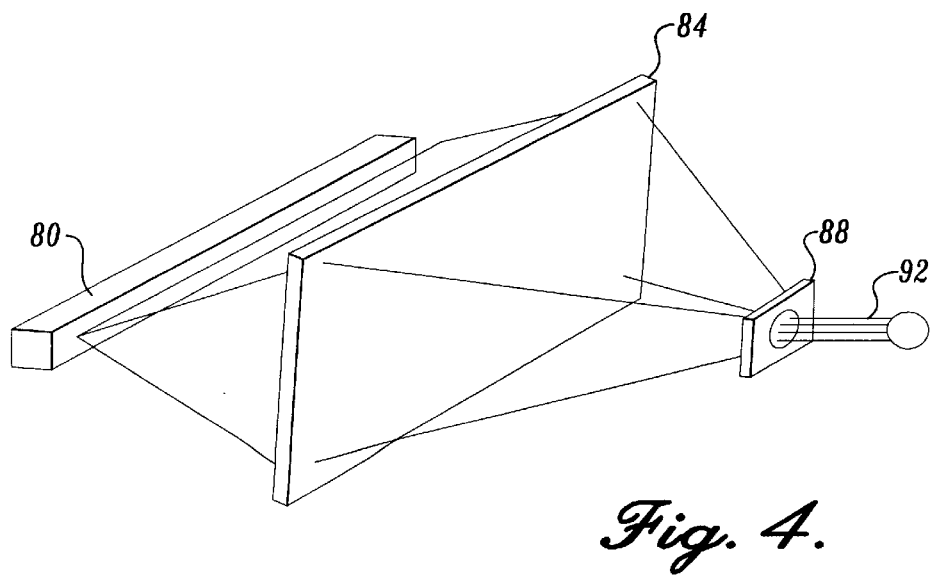
FIG. 4 is a perspective view of another embodiment of a two-dimensional beam shaper/concentrator, made in accordance with the present invention.

FIG. 4 shows laser shaping apparatus for shaping divergent laser beams emitted by a laser bar or broad area diode laser 80 into a high power, narrow laser beam 92. The divergent laser beams from the laser bar or broad area diode laser 80 are intercepted by diffractive or digital optics 84 and bent and concentrated towards a second diffractive optical element 88 which bends the received laser beams into the narrow beam 92.

The difference between the apparatus of FIG. 4 and the apparatus of FIG. 3 is that there is no laser beam columnating step in FIG. 4 as there is in FIG. 3. Rather, the divergent laser beams emitted from the laser source 80 are intercepted directly by the diffractive or digital optical element 84 which then concentrates the beams toward the diffractive or digital optics 88 which then produces the narrow laser beam 92.

Figure 5:
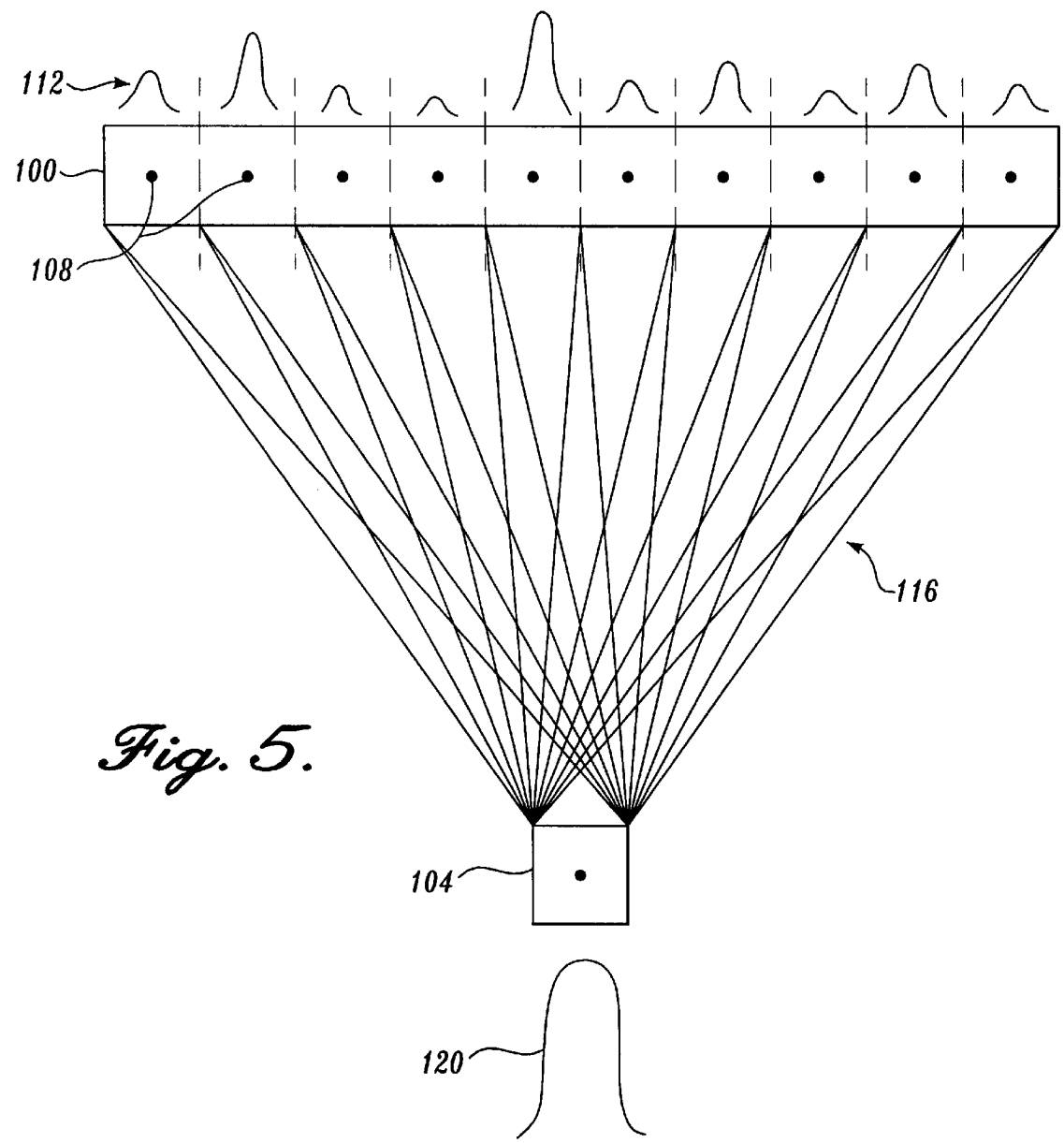
FIG. 5 illustrates graphically the function of the shaping and concentrating devices of the present invention for concentrating a broad area laser beam from a broad area diode laser into a narrow width spot and beam.

FIG. 5 illustrates graphically the function of the shaping and concentrating apparatus particularly of FIG. 1 to concentrate a broad area laser beam from a broad area diode laser into a narrow width spot and beam 104. As mentioned earlier, broad area diode lasers produce desirable higher output power but also are accompanied by an undesirable breakup of the spatial beam pattern along the lateral dimension of the laser. This break-up or mode collapse is known as filamentation, and is manifest by spatially separated "hot spots", represented at 108, in the beam pattern. The variation in intensity along the broad area diode laser aperture, resulting from the filamentation, is shown graphically at 112.

The function of the beam shaper and concentrator of FIG. 1 in focusing the beams down to the beam spot 104 is represented by the converging lines 116 of FIG. 5. The intensity profile of the beam spot 104 is shown at 120 to represent the mapping of each hot spot 108 on top of one another and thus reduce the filamentation problem through the averaging effect of the beam shaper and concentrator. Also the spot size of the broad area diode laser 100 is concentrated to a size and configuration for easy coupling to a fiber optic strand, non-linear crystal, or the like as represented, for example, in FIG. 7.

Figure 6:
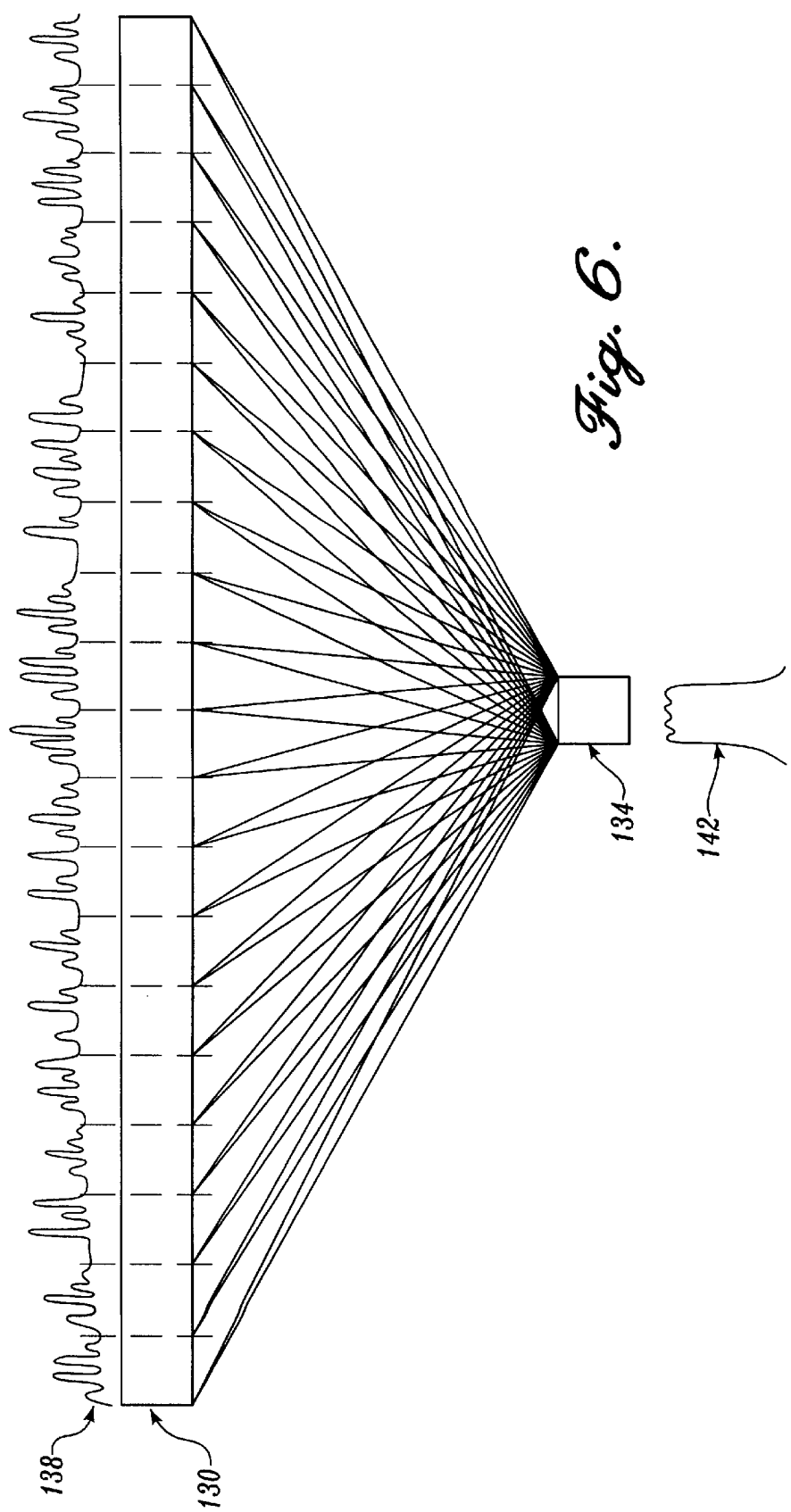
FIG. 6 shows graphically the function of the shaping and concentrating devices of the present invention for concentrating a broad area laser beam from a diode laser bar or diode laser array into a narrow width spot and beam.

FIG. 6 illustrates graphically the function of the shaping and concentrating apparatus of FIG. 3 or FIG. 4 for concentrating a broad area laser beam from a diode laser bar or assembled diode laser array 130 into a narrow width spot and beam 134. The intensity profiles along the apertures of broad area diode lasers in the laser bar or laser array 130 are shown at 138, and the intensity profile after the shaping and concentrating has been carried out is shown at 142. Of course, the function of the apparatus shown in FIG. 6 illustrates the reduction of the filamentation problem and that the resulting narrow beam can be coupled to a fiber optics strand or non-linear crystal, as discussed before.

Figure 7:
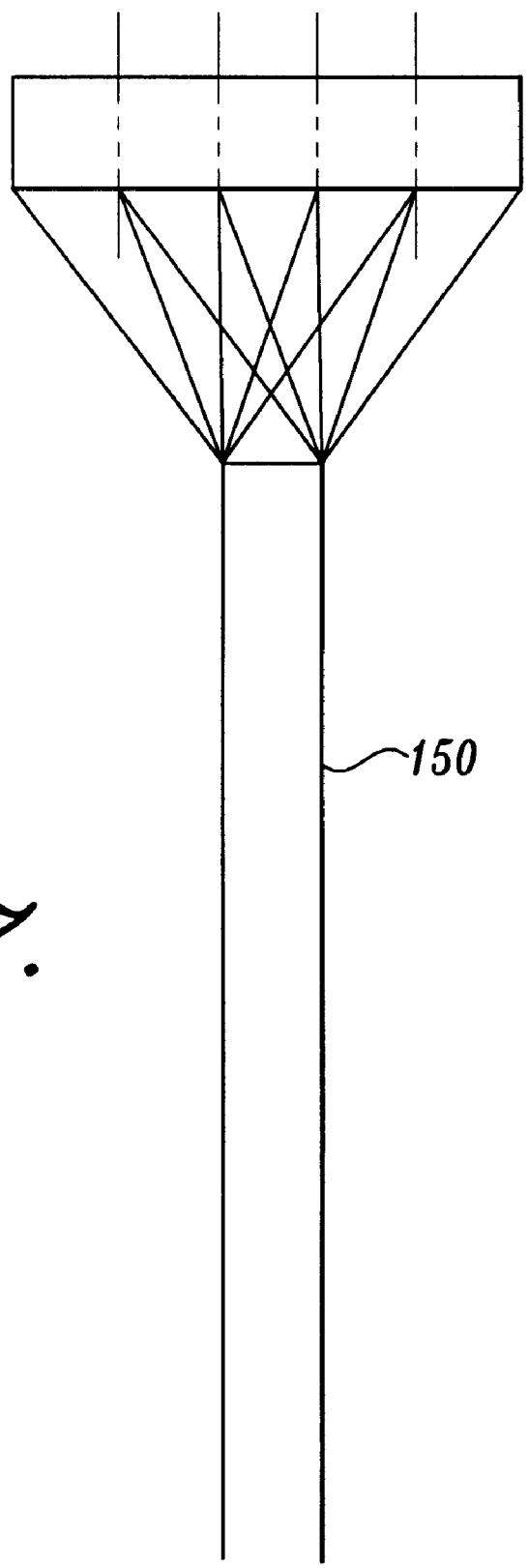
FIG. 7 is a side, elevational view showing a concentrated laser beam coupled into an optical fiber, nonlinear crystal, or other light transmission, amplification and/or frequency/wavelength converting device.

FIG. 7 shows a concentrated, narrowed laser beam coupled to a fiber optics strand, non-linear crystal or the like 150 as previously described.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. Apparatus for shaping broad area laser beams developed by a laser source into a narrow laser beam comprising
    collimating means disposed adjacent the laser source for collimating the broad area laser beams into a sheet of laser beams, directed in a first direction, and
    diffractive/digital optics disposed in the first direction from the collimating means for shaping the collimated beams into a narrow laser beam.

2. Apparatus as in claim 1 wherein said collimating means comprises means defining at least an elongate, hemi-parabolic-shaped reflective surface formed about a parabolic focal line, said laser source being disposed along the focal line.

3. Apparatus as in claim 2 wherein said collimating means comprises a transparent body of material, at least one side of which is formed with the at least elongate, hemi-parabolic-shaped surface, coated with an inwardly reflective coating such that laser beams emanating from the focal line through the body of material are reflected from the reflective coating toward said first direction.

4. Apparatus as in claim 3 wherein said reflective coating is selected from the group consisting of aluminum, nickel, silver and gold.

5. Apparatus as in claim 1 wherein said diffractive/digital optics comprises
    first optics means for receiving the sheet of collimated beams and causing them to converge toward a location, and
    second optics means disposed between the first optics means and said location for intercepting the converging beams and forming them into the narrow laser beam.

6. Apparatus as in claim 1 wherein said diffractive/digital optics comprises means for mapping spatially separated portions of the collimated beans onto substantially the same spot to form the narrow laser beam.

7. Apparatus as in claim 6 wherein the spot shape is substantially rectangular.

8. Apparatus as in claim 7 wherein the spot shape is substantially square.

9. Apparatus as in claim 6 further including a non-linear crystal into which the narrow laser beam is coupled.

10. Apparatus as in claim 6 further including an optical fiber into one end of which the narrow laser beam is coupled.

11. Apparatus for mapping different, spaced-apart portions of a broad area laser beam onto a single, narrow beam in overlapping relationship, comprising
    means for developing a broad area laser beam,
    means for forming the broad area laser beam into a spatially dispersed, collimated beam, and
    means for mapping different, spaced-apart portions of the collimated beam onto a single, narrow beam in overlapping relationship.

12. Apparatus as in claim 11 further including means for applying the narrow beam to an optical fiber.

13. Apparatus as in claim 11 further including means for applying the narrow beam to a non-linear crystal.

14. Apparatus as in claim 11 further including means for applying the narrow beam to a solid-state laser or harmonic diode laser, to pump the laser.

15. Apparatus for shaping the output laser beams from a two-dimensional diode laser array, into a narrow, overlapped laser beam comprising:

means for collimating the output laser beams into a plurality of approximately parallel laser beam sheets directed in a first direction, diffractive/digital optics disposed in the first direction for shaping the laser beam sheets into a narrow, overlapped laser beam.

16. Apparatus as in claim 15 wherein said diffractive/digital optics comprises:

first optics means for receiving the laser beam sheets and directing and concentrating them toward a point, and second optics means disposed between the first optics means and said point for receiving the concentrated beams and shaping them into the narrow, overlapped laser beam.

17. Apparatus for concentrating the output of a broad area diode laser, diode laser bar or diode laser array which emits laser light from an elongate aperture forwardly and divergently, said apparatus comprising:

first diffractive/digital optics means disposed forwardly of the broad area diode laser, diode laser bar or diode laser array in the path of the laser light, for causing the laser light to converge toward a point, and second diffractive/digital optics means disposed between the first diffractive/digital optics means and the point, for shaping the converging laser light into a narrow laser beam.

* * * * *